United States Patent
Yeh et al.

(10) Patent No.: US 9,947,594 B2
(45) Date of Patent: Apr. 17, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chih-Yang Yeh, Hsinchu County (TW); Shun-Jang Liao, Taoyuan (TW); Shu-Hui Wang, Hsinchu (TW); Chun-Sheng Liang, Changhua County (TW); Kuo-Hua Pan, Hsinchu (TW); Jeng-Ya David Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/268,890

(22) Filed: Sep. 19, 2016

(65) Prior Publication Data

US 2018/0082908 A1    Mar. 22, 2018

(51) Int. Cl.
*H01L 27/092* (2006.01)
*H01L 21/28* (2006.01)
*H01L 21/8238* (2006.01)
*H01L 29/49* (2006.01)

(52) U.S. Cl.
CPC ......... *H01L 21/823842* (2013.01); *H01L 21/823821* (2013.01); *H01L 27/0924* (2013.01); *H01L 29/4966* (2013.01)

(58) Field of Classification Search
CPC ....... H01L 29/66545; H01L 21/823842; H01L 29/4966; H01L 29/517; H01L 29/7833; H01L 21/28088; H01L 29/513; H01L 21/823857; H01L 21/823807; H01L 29/7848; H01L 29/6659
USPC ............ 257/369, E27.062, E21.19, E29.255, 257/E21.632, 410, E21.409; 438/199, 438/591–592
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,012,319 B1* | 4/2015 | Choi | H01L 21/28158 438/591 |
| 2012/0244669 A1* | 9/2012 | Liao | H01L 21/823807 438/212 |
| 2013/0075826 A1* | 3/2013 | Xu | H01L 29/4966 257/369 |
| 2014/0252423 A1* | 9/2014 | Tsao | H01L 29/66545 257/288 |
| 2014/0282326 A1 | 9/2014 | Chen et al. | |

(Continued)

*Primary Examiner* — Jonathan Han
(74) *Attorney, Agent, or Firm* — McClure, Qualey & Rodack, LLP

(57) ABSTRACT

A semiconductor device includes a first semiconductor channel, a second semiconductor channel, a first gate stack and a second gate stack. The first gate stack includes N-work function metal present on the first semiconductor channel. The second gate stack includes N-work function metal present on the second semiconductor channel. The N-work function metal in the first gate stack and the second gate stack are substantially different. The difference includes at least one of N-work function metal type and N-work function metal amount.

20 Claims, 13 Drawing Sheets

(56) References Cited

U.S. PATENT DOCUMENTS

2015/0214112 A1\* 7/2015 Zhao .................. H01L 29/4966
                                                                                                 257/369
2015/0262828 A1\* 9/2015 Brand ............. H01L 21/823842
                                                                                                 438/592

\* cited by examiner

SEMICONDUCTOR DEVICE AND MANUFACTURING METHOD THEREOF

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed by etching spaced recesses into a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
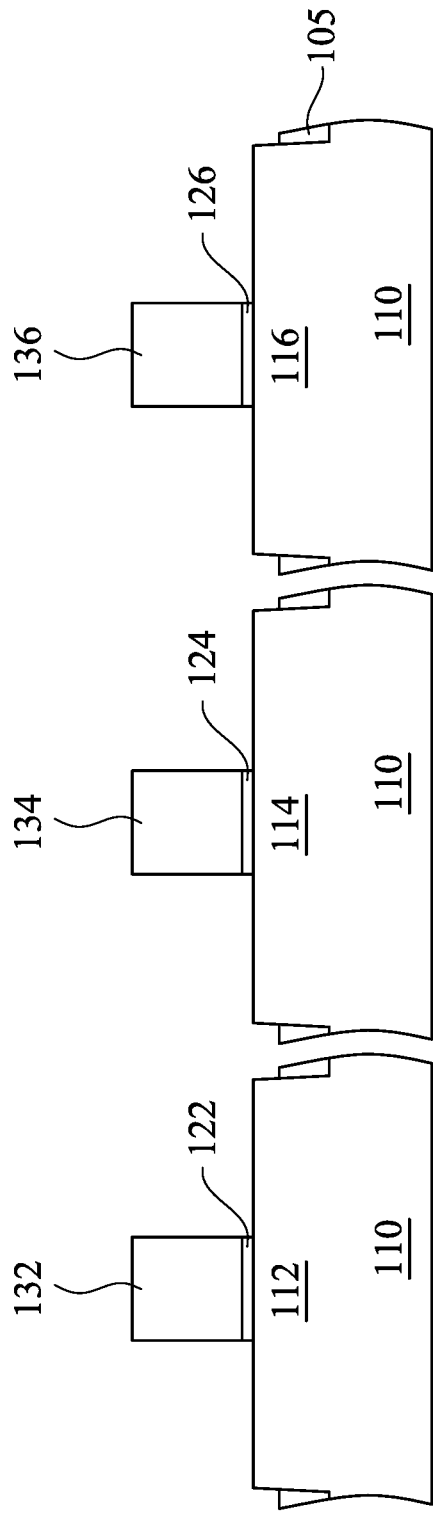
FIG. 1 to FIG. 13 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, may be a Fin field effect transistor (FinFET) device. The following disclosure will continue with a FinFET example to illustrate various embodiments of the present application. It is understood, however, that the application should not be limited to a particular type of device.

FIG. 1 to FIG. 13 are cross-sectional views of a method for manufacturing a semiconductor device at various stages in accordance with some embodiments of the present disclosure. Reference is made to FIG. 1. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

Semiconductor fins 112, 114 and 116 are formed on the substrate 110. In some embodiments, the semiconductor fins 112, 114 and 116 include silicon. The semiconductor fins 112, 114 and 116 may be formed, for example, by patterning and etching the substrate 110 using photolithography techniques. In some embodiments, a layer of photoresist material (not shown) is sequentially deposited over the substrate 110. The layer of photoresist material is irradiated (exposed) in accordance with a predetermined pattern (the semiconductor fins 112, 114 and 116 in this case) and developed to remove portions of the photoresist material. The remaining photoresist material protects the underlying material from subsequent processing steps, such as etching. It is noted that other masks, such as an oxide or silicon nitride mask, may also be used in the etching process. The quantity of the semiconductor fins is exemplary, and is not limiting the disclosure.

An isolation dielectric 105 is formed to fill trenches among the semiconductor fins 112, 114 and 116 as shallow trench isolation (STI). The isolation dielectric 105 may include any suitable dielectric material, such as silicon oxide. The method of forming the isolation dielectric 105 may include depositing an isolation dielectric 105 on the substrate 110 to cover the semiconductor fins 112, 114 and 116, optionally performing a planarization process to remove the excess isolation dielectric 105 outside the trenches, and then performing an etching process on the isolation dielectric 105 until upper portions of the semiconductor fins 112, 114 and 116 are exposed.

Gate dielectrics 122, 124 and 126 are formed on the semiconductor fins 112, 114 and 116, and the substrate 110, respectively. The gate dielectrics 122, 124 and 126 may be formed by thermal oxidation, chemical vapor deposition, sputtering, or other suitable methods for forming a gate dielectric. The gate dielectrics 122, 124 and 126 can be patterned to respectively wrap central portions of the semiconductor fins 112, 114 and 116 and respectively expose portions of the semiconductor fins 112, 114 and 116. At least one of the gate dielectrics 122, 124 and 126 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, at least one of the gate dielectrics 122, 124 and 126 may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. At least one of the gate dielectrics 122, 124 and 126 may have a multilayer structure such as one layer of silicon oxide (e.g., interfacial layer) and another layer of high-k material. At least one of the gate dielectrics 122, 124 and 126 may be formed using chemical vapor deposition (CVD), physical vapor deposition (PVD), atomic layer deposition (ALD), thermal oxide, ozone oxidation, other suitable processes, or combinations thereof.

Dummy gate structures 132, 134 and 136 are respectively formed on the gate dielectrics 122, 124 and 126. At least one of the dummy gate structures 132, 134 and 136 may be formed by CVD, sputter deposition, or by other suitable technique for depositing conductive materials. The dummy gate structures 132, 134 and 136 can be patterned to respectively wrap central portions of the semiconductor fins 112, 114 and 116 and respectively expose portions of the semiconductor fins 112, 114 and 116. In some embodiments, the gate dielectrics 122, 124 and 126 and the dummy gate structures 132, 134 and 136 may be patterned by the same process. At least one of the dummy gate structures 132, 134 and 136 may include polycrystalline-silicon (poly-Si) or poly-crystalline silicon-germanium (poly-SiGe).

Figure 2:
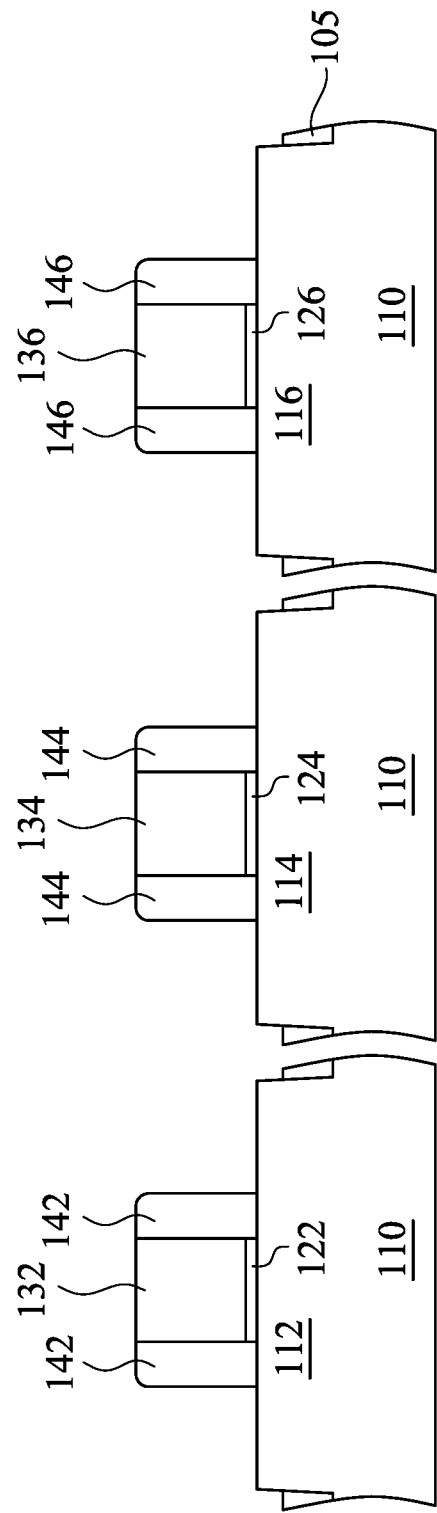

Reference is made to FIG. 2. Gate spacers 142 are formed on the substrate 110 and respectively along opposite sides of the dummy gate structure 132, gate spacers 144 are formed on the substrate 110 and respectively along opposite sides of the dummy gate structure 134, and gate spacers 146 are formed on the substrate 110 and along opposite sides of the dummy gate structure 136. In some embodiments, the gate spacers 142, 144 and 146 may include silicon oxide, silicon nitride, silicon oxy-nitride, or other suitable material. The gate spacers 142, 144 and 146 may include a single layer or multilayer structure. To form the gate spacers 142, 144 and 146, a blanket layer may be formed on the substrate 110 by CVD, PVD, ALD, or other suitable technique. Then, an anisotropic etching is performed on the blanket layer to form the gate spacers 142, 144 and 146 respectively on opposite sides of the dummy gate structures 132, 134 and 136. In some embodiments, the gate spacers 142, 144 and 146 can be used to offset subsequently formed doped regions, such as source/drain regions. The gate spacers 142, 144 and 146 can further be used for designing or modifying the source/drain region (junction) profile.

Figure 3:
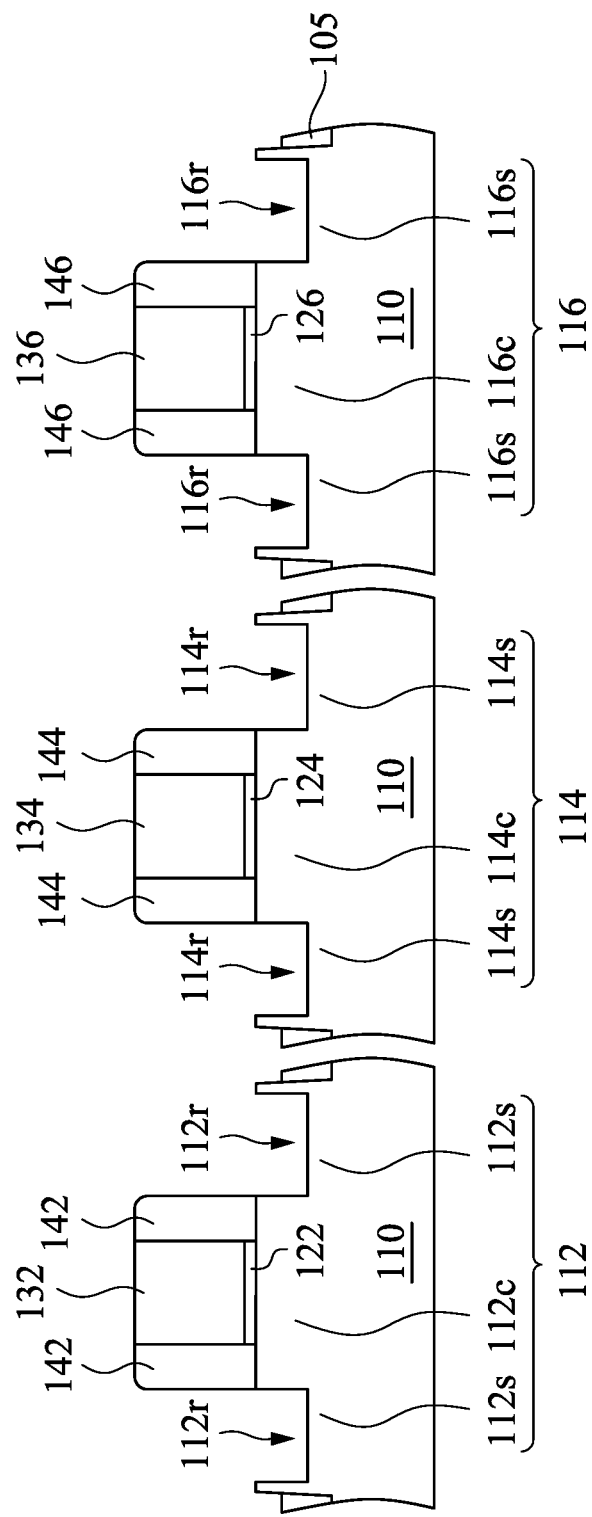

Reference is made to FIG. 3. Portions of the semiconductor fins 112, 114 and 116 exposed by the dummy gate structures 132, 134 and 136 and the gate spacers 142, 144 and 146 are removed (or recessed) to form recesses 112r, 114r and 116r in the substrate 110. Any suitable amount of material may be removed. The remaining semiconductor fin 112 has a plurality of source/drain portions 112s, and a portion of the semiconductor fin 112 between the source/drain portions 112s can serve as a semiconductor channel 112c. Similarly, there are a plurality of source/drain portions 114s and a semiconductor channel 114c present in the remaining semiconductor fin 114, and there are a plurality of source/drain portions 116s and a semiconductor channel 116c present in the remaining semiconductor fin 116. The source/drain portions 112s, 114s and 116s are embedded in the substrate 110 and portions thereof are exposed by the recesses 112r, 114r and 116r, respectively. The semiconductor channels 112c, 114c and 116c respectively underlie the dummy gate structures 132, 134 and 136.

Removing portions of the semiconductor fins 112, 114 and 116 may include forming a photoresist layer or a capping layer (such as an oxide capping layer) over the structure of FIG. 2, patterning the photoresist or capping layer to have openings that expose portions of the semiconductor fins 112, 114 and 116, and etching the exposed portions of the semiconductor fins 112, 114 and 116. In some embodiments, the semiconductor fins 112, 114 and 116 can be etched using a dry etching process. Alternatively, the etching process is a wet etching process or combination of dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 112r, 114r and 116r with hydrogen fluoride (HF) or other suitable solution.

Figure 4:
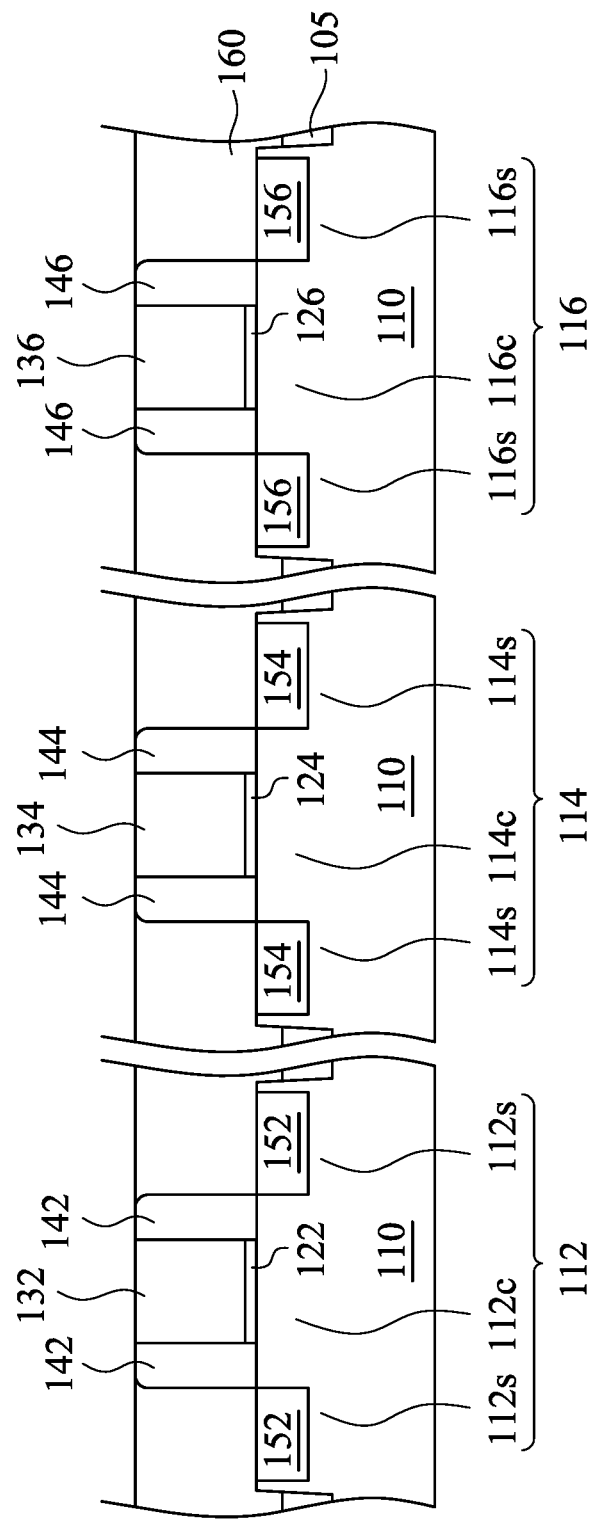

Reference is made to FIG. 4. A plurality of epitaxy structures 152, 154 and 156 are respectively formed in the recesses 112r, 114r and 116r (see FIG. 3) and on the source/drain portions 112s, 114s and 116s. The epitaxy structures 152, 154 and 156 may be formed using one or more epitaxy or epitaxial (epi) processes, such that Si features, SiGe features, and/or other suitable features can be formed in a crystalline state on the source/drain portions 112s, 114s and 116s of the semiconductor fins 112, 114 and 116. In some embodiments, the lattice constant of the epitaxy structures 152, 154 and 156 are different from the lattice constant of the semiconductor fins 112, 114 and 116, so that semiconductor channels 112c, 114c and 116c can be strained or stressed by the epitaxy structures 152, 154 and 156 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portions 112s, 114s and 116s of the semiconductor fins 112, 114 and 116 (e.g., silicon). Thus, strained or stressed semiconductor channels 112c, 114c and 116c can be achieved to increase carrier mobility and enhance device performance. The epitaxy structures 152, 154 and 156 may be in-situ doped. The doping species include P-type dopants, such as boron or $BF_2$; N-type dopants, such as phosphorus or arsenic; and/or other suitable dopants including combinations thereof. If the epitaxy structures 152, 154 and 156 are not in-situ doped, a second implantation process (i.e., a junction implant process) is performed to dope the epitaxy structures 152, 154 and 156. One or more annealing processes may be performed to activate the epitaxy structures 152, 154 and 156. The annealing processes include rapid thermal annealing (RTA) and/or laser annealing processes.

Thereafter, an interlayer dielectric (ILD) layer 160 is formed at outer sides of the gate spacers 142, 144 and 146 and on the substrate 110. The ILD layer 160 includes silicon oxide, silicon nitride, silicon oxynitride, silicon carbide, low-dielectric constant dielectric material or a combination thereof. The ILD layer 160 includes a single layer or multiple layers. The ILD layer 160 is formed by a suitable technique, such as CVD. A chemical mechanical planarization (CMP) process may be applied to remove excessive ILD layer 160 and expose top surfaces of the dummy gate structures 132, 134 and 136 to a subsequent dummy gate removal process.

Figure 5:
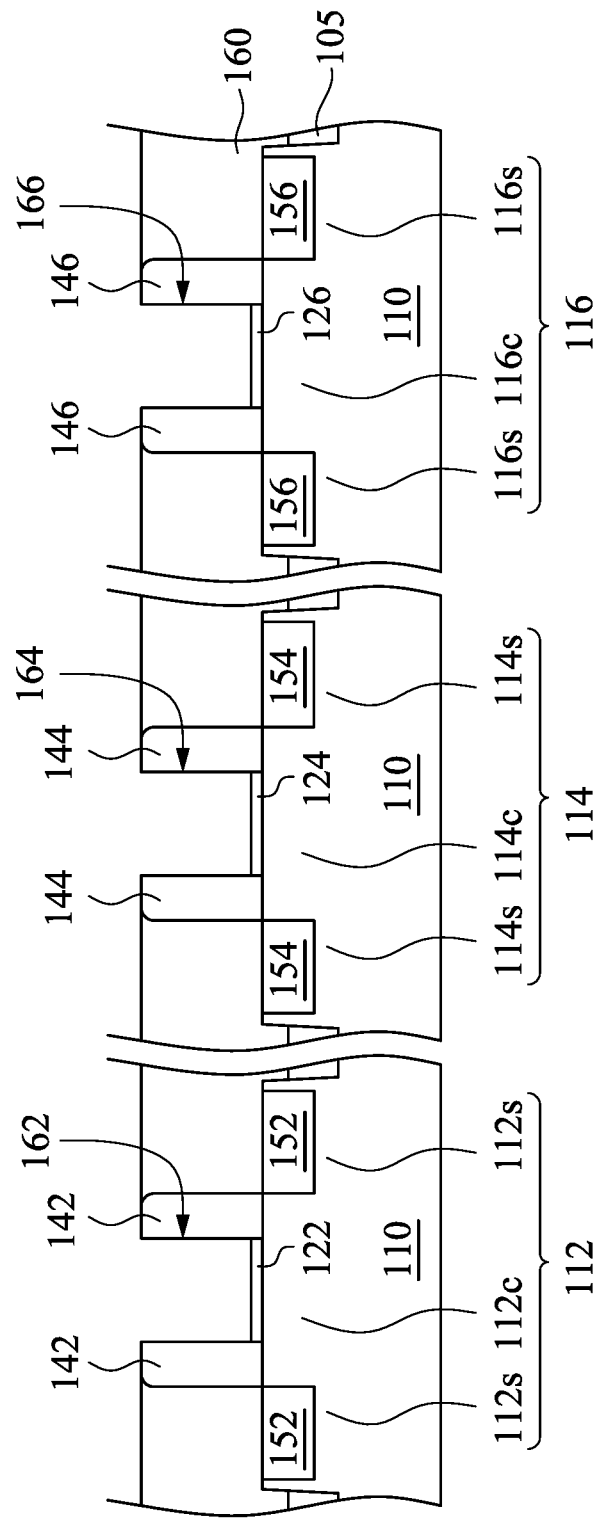

Reference is made to FIG. 5. The dummy gate structures 132, 134 and 136 (see FIG. 4) are removed to form an opening 162 with the gate spacers 142 as its sidewall, an opening 164 with the gate spacers 144 as its sidewall, and an opening 166 with the gate spacers 146 as its sidewall. In some embodiments, the gate dielectrics 122, 124 and 126 are removed as well. Alternatively, in some embodiments, the dummy gate structures 132, 134 and 136 are removed while the gate dielectrics 122, 124 and 126 retain as shown in FIG. 5. The dummy gate structures 132, 134 and 136 (and the gate dielectrics 122, 124 and 126) may be removed by dry etching, wet etching, or a combination of dry and wet etching. For example, a wet etching process may include exposure to a hydroxide containing solution (e.g., ammonium hydroxide), deionized water, and/or other suitable etchant solutions.

Figure 6:
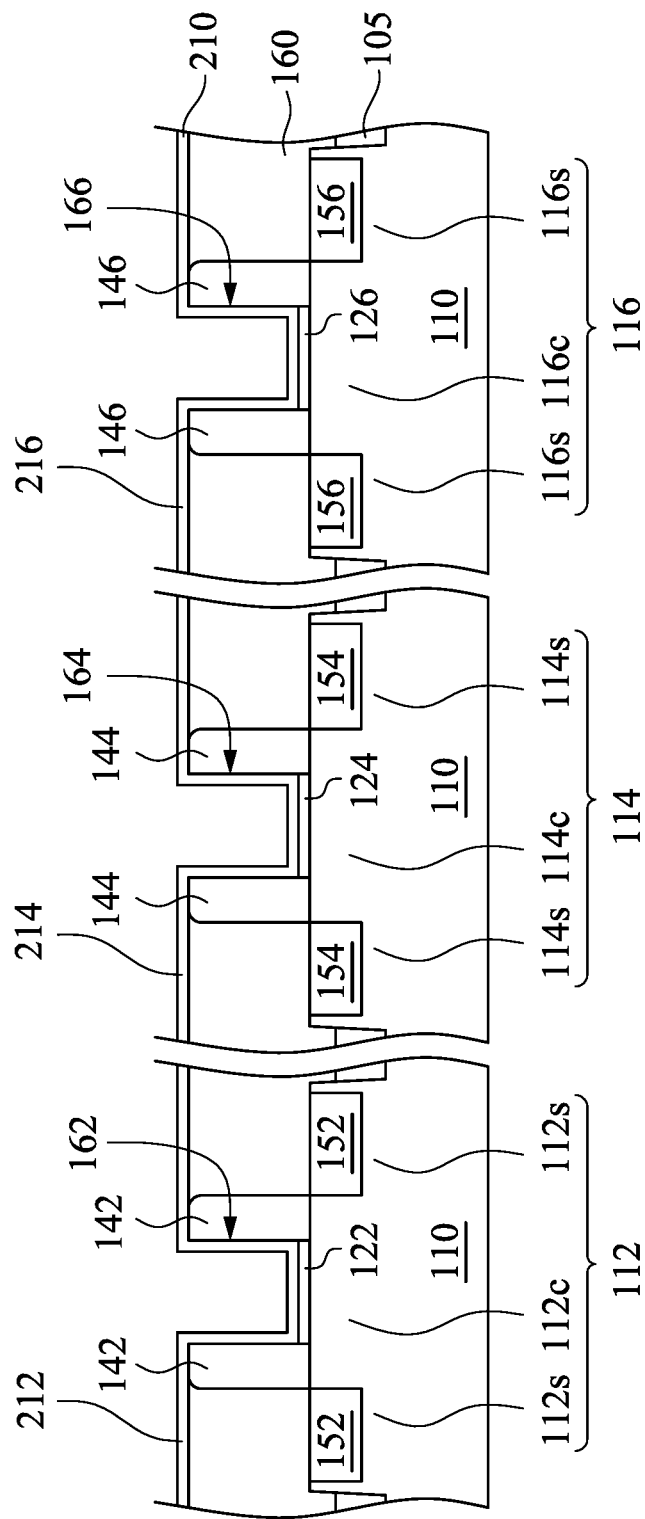

Reference is made to FIG. 6. A P-work function metal 210 can be formed on the structure shown in FIG. 5. In other words, the P-work function metal 210 is formed on the semiconductor channels 112c, 114c and 116c. The P-work function metal 210 may include, but is not limited to, titanium nitride (TiN). Titanium nitride can provide a work function suitable for PMOS devices, which work function is higher than the mid-gap work function (about 4.5 eV) that is in the middle of the valance band and the conduction band of silicon. The work function higher than the mid-gap work function is referred to as a P-work function, and the respective metal having the P-work function is referred to as a P-work function metal or P-metal. The P-work function metal 210 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. Portions of the P-work function metal 210 respectively present on the semiconductor fins 112, 114 and 116 can be referred to as P-work function metal layers 212, 214 and 216. In some embodiments, an additional diffusion barrier, such as a tantalum nitride (TaN) layer, may be formed on the gate dielectrics 122, 124 and 126, and the P-work function metal 210 is formed on the diffusion barrier.

Figure 7:
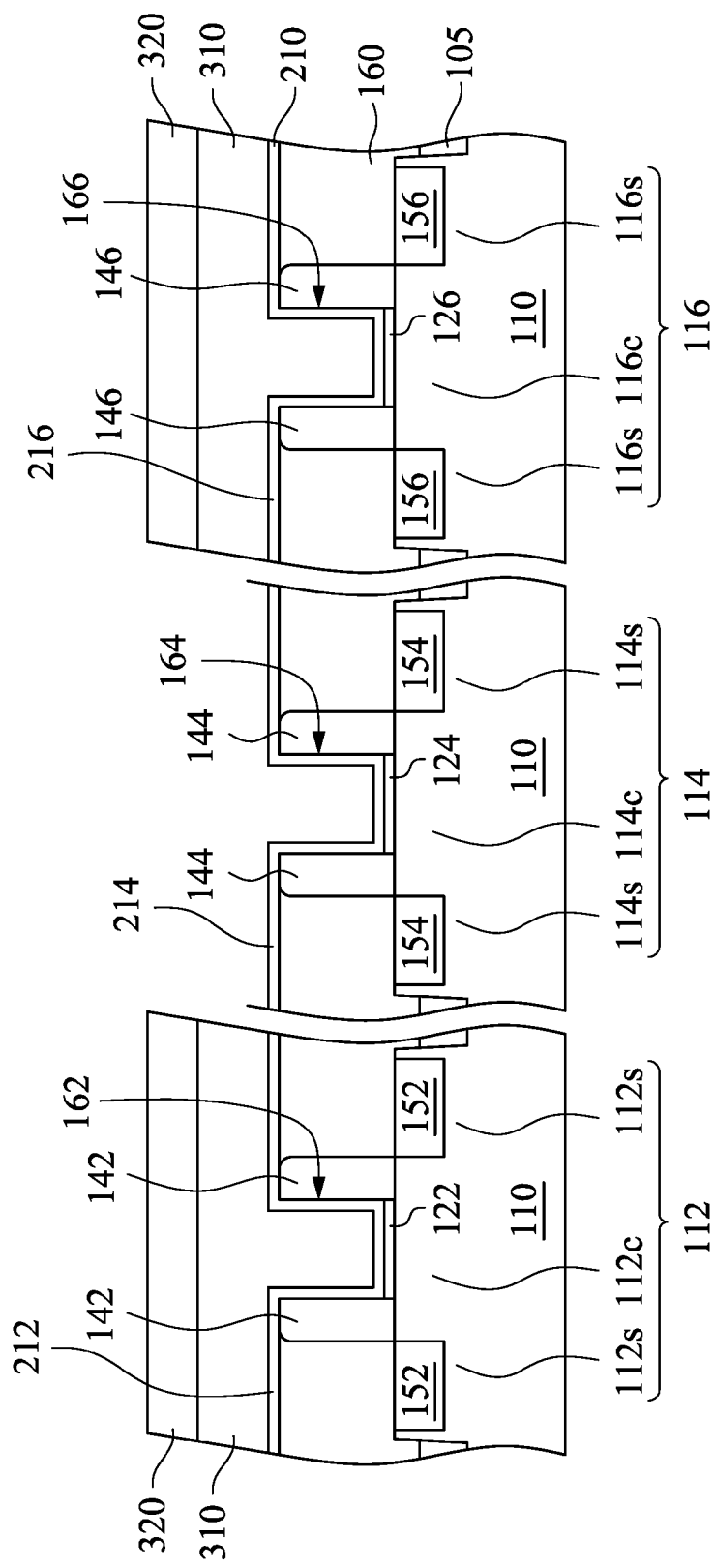

Reference is made to FIG. 7. A dielectric material 310, e.g. spin-on-glass (SOG), can be formed, covering and protecting the P-work function metal layers 212 and 216 on the semiconductor fins 112 and 116 and filling the openings 162 and 166. A photoresist 320 can be defined over the dielectric material 310. The dielectric material 310 and the photoresist 320 can be provided for patterning the P-work function metal 210. The dielectric material 310 and the photoresist 320 can be defined by, for example, a spin-on process, a photolithographic process, and an etching process.

Figure 8:
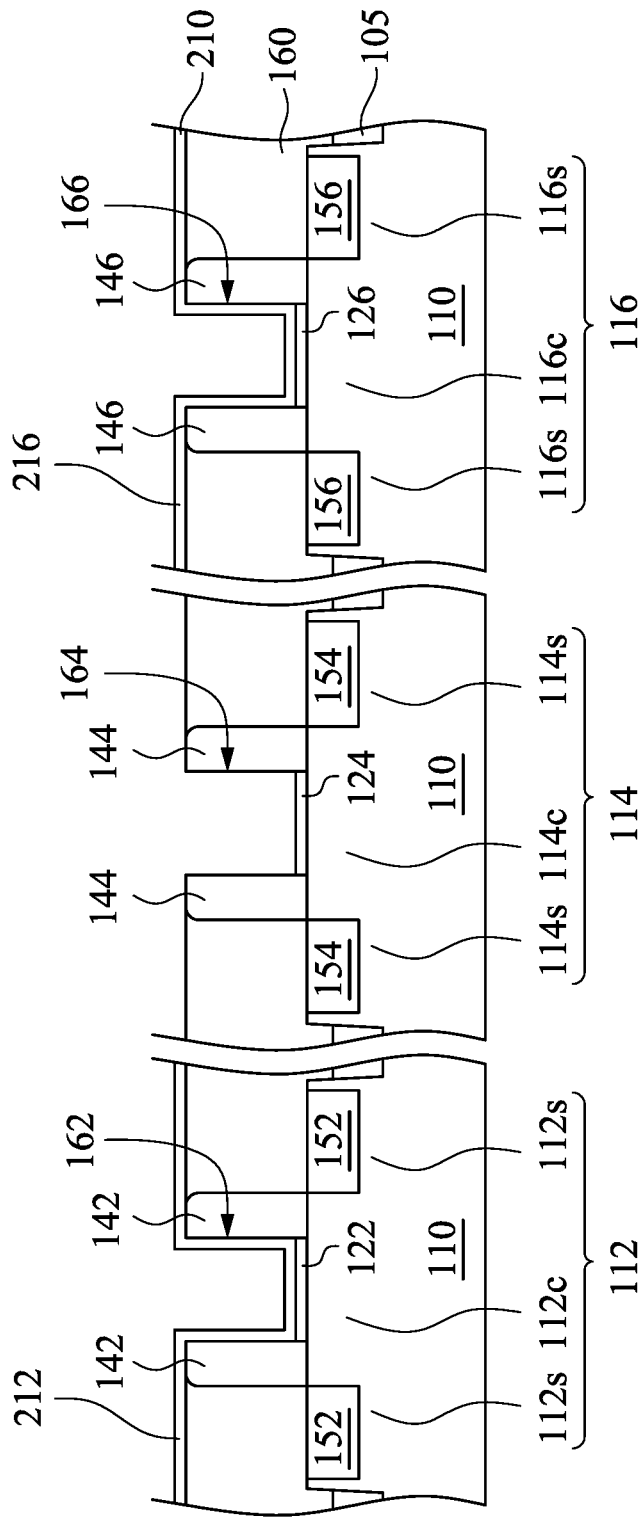

Reference is made to FIG. 8. The P-work function metal layer 214 on the semiconductor fin 114 that is not covered by the dielectric material 310 and the photoresist 320 shown in FIG. 7 can be removed. After removing the P-work function metal layer 214 on the semiconductor fin 114, the dielectric material 310 and the photoresist 320 shown in FIG. 7 can be removed by a wet etching process, a dry etching process, or combinations thereof.

Figure 9:
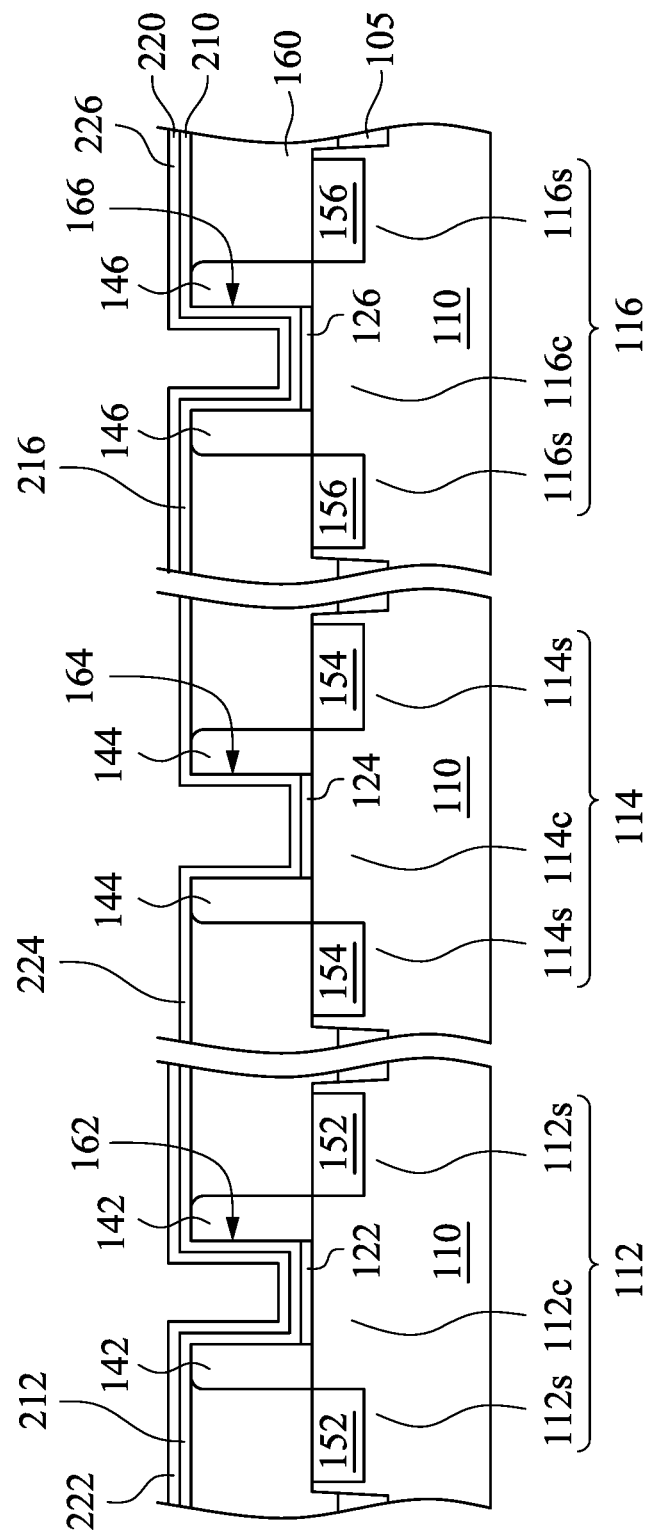

Reference is made to FIG. 9. A first N-work function metal 220 can be formed on the structure shown in FIG. 8. The first N-work function metal 220 provides the work function suitable for NMOS devices, which work function is lower than the mid-gap work function. The work function lower than the mid-gap work function is referred to as an N-work function, and the respective metal having the N-work function may be referred to as an N-work function metal or an N-metal. In some embodiments, the first N-work function metal 220 has an N-work function lower than about 4.3 eV. The N-work function of first N-work function metal 220 may also be in the range between about 3.8 eV and about 4.6 eV. In some embodiments, the first N-work function metal 220 may include titanium aluminum (TiAl), which may include, or free from or substantially free from other elements. In some other embodiments, the first N-work function metal may include Ti, Ag, Al, TiAlN, TiAlC, TaC, TaCN, TaAlC, TaSiN, Mn, Zr or combinations thereof. The first N-work function metal 220 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. In accordance with some embodiments, the first N-work function metal 220 is formed at room temperature (for example, about 20° C. to about 25° C.). In alternative embodiments, the first N-work function metal 220 is formed at an elevated temperature higher than the room temperature, for example, higher than about 200° C. Portions of the first N-work function metal 220 respectively present on the semiconductor fins 112, 114 and 116 can be referred to as first N-work function metal layers 222, 224 and 226.

Figure 10:
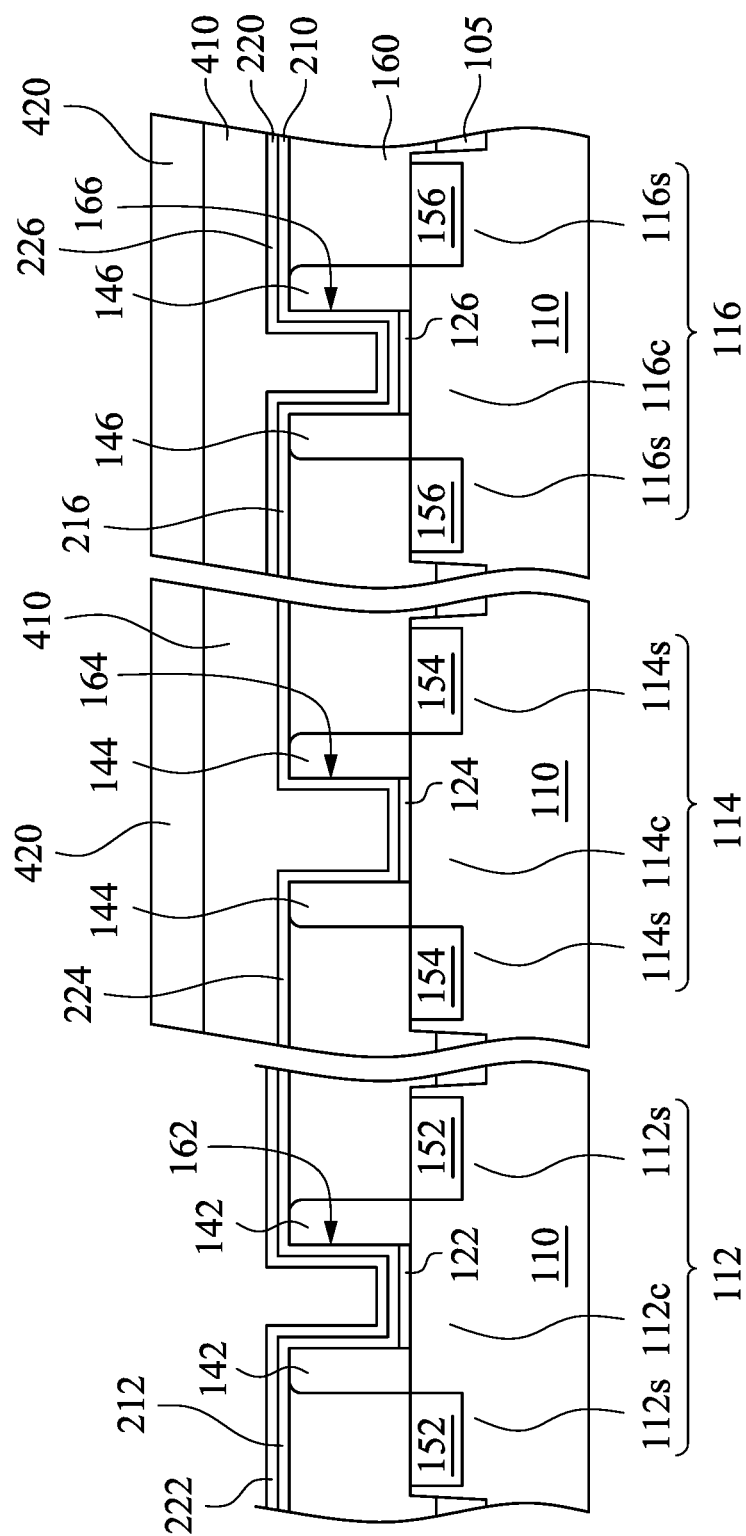

Reference is made to FIG. 10. A dielectric material 410, e.g. spin-on-glass (SOG), can be formed, covering and protecting the first N-work function metal layers 224 and 226 on the semiconductor fins 114 and 116 and filling the opening 164 and 166. A photoresist 420 can be defined over the dielectric material 410. The dielectric material 410 and/or the photoresist 420 can be provided for patterning the first N-work function metal 220. The dielectric material 410 and the photoresist 420 can be defined by, for example, a spin-on process, a photolithographic process, and an etching process.

Figure 11:
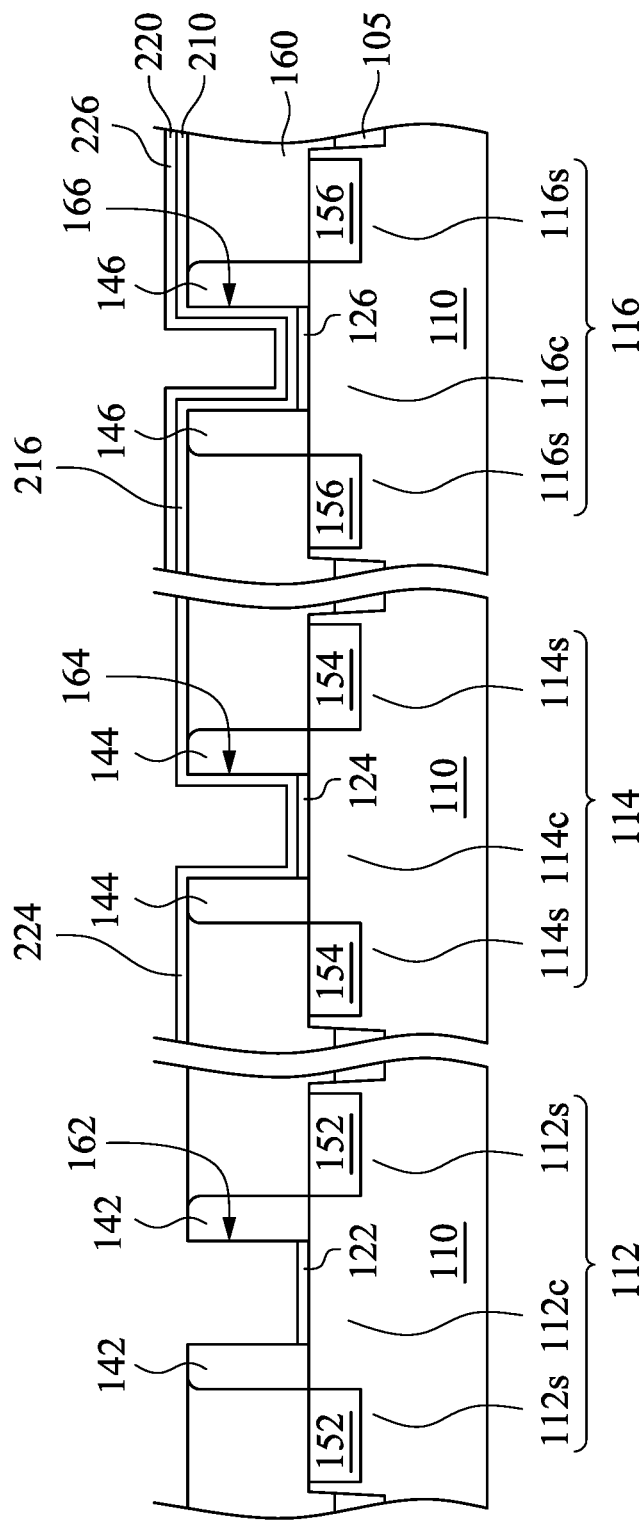

Reference is made to FIG. 11. The first N-work function metal layer 222 and at least a portion of the P-work function metal layer 212 on the semiconductor fin 112 that are not covered by the dielectric material 410 and the photoresist 420 shown in FIG. 10 can be removed, so that the first N-work function metal 220 can be patterned to remain on the semiconductor fins 114 and 116, and not on the semiconductor fin 112. After patterning the first N-work function metal 220, the dielectric material 410 and the photoresist 420 shown in FIG. 10 can be removed by a wet etching process, a dry etching process, or combinations thereof, exposing the remained first N-work function metal 220.

Figure 12:
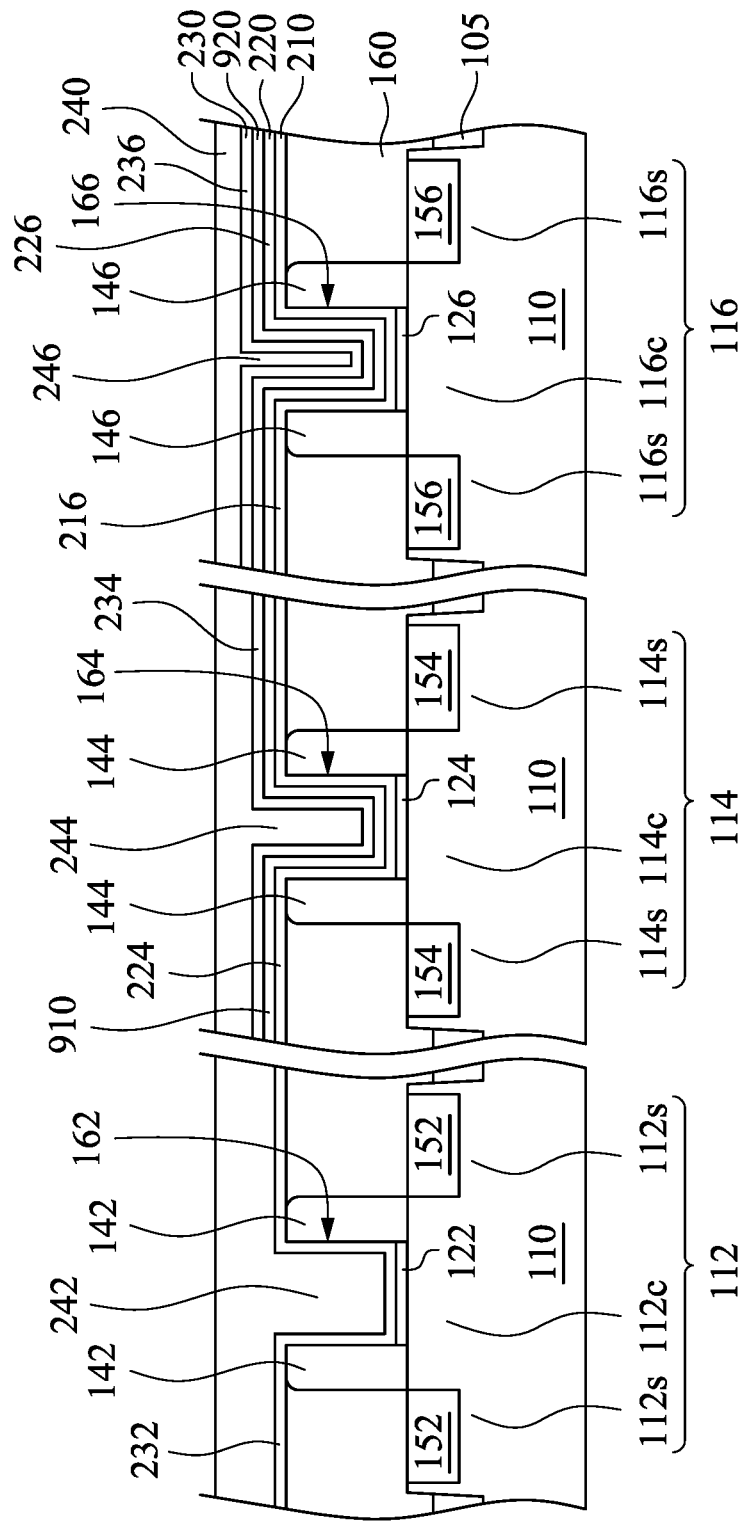

Reference is made to FIG. 12. A second N-work function metal 230 can be formed on the structure shown in FIG. 11. The second N-work function metal 230 provides the work function suitable for NMOS devices, which work function is lower than the mid-gap work function. In some embodiments, the second N-work function metal 230 has an N-work function lower than about 4.3 eV. The N-work function of second N-work function metal 230 may also be in the range between about 3.8 eV and about 4.6 eV. In some embodiments, the N-work function of the second N-work function metal 230 is different from that of the first N-work function metal 220, so as to benefit achieving different threshold voltages for different FinFETs. In other words, the first N-work function metal 220 and the second N-work function metal 230 can be made of different materials. In some other embodiments, the first N-work function metal 220 and the second N-work function metal 230 can be made of substantially the same material. In some embodiments, the second N-work function metal 230 include Ti, Ag, Al, TiAl, TiAlN, TiAlC, TaC, TaCN, TaSiN, Mn, Zr or combinations thereof. The second N-work function metal 230 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. In accordance with some embodiments, the second N-work function metal 230 is formed at room temperature (for example, about 20° C. to about 25° C.). In alternative embodiments, the second N-work function metal 230 is formed at an elevated temperature higher than the room temperature, for example, higher than about 200° C. Portions of the second N-work function metal 230 respectively present on the semiconductor fins 112, 114 and 116 can be referred to as second N-work function metal layers 232, 234 and 236.

In some embodiments, before forming the second N-work function metal 230, the first N-work function metal layers 224 and 226 may be exposed to oxygen to permit oxidation to occur, and therefore, oxidation layers 910 and 920 may be respectively formed on the first N-work function metal layers 224 and 226. Since the oxidation layer 910 is formed due to the oxidation of the first N-work function metal layer 224, the oxidation layer 910 may be in contact with the first N-work function metal layer 224 and may include metal substantially the same as that of the first N-work function metal layer 224. Similarly, the oxidation layer 920 may be in contact with the first N-work function metal layer 226 and may include metal substantially the same as that of the first N-work function metal layer 226. For example, when the first N-work function metal 220 includes aluminum (Al), the oxidation layers 910 and 920 may be aluminum and oxygen (O) rich. The second N-work function metal layers 234 and 236 are formed on the oxidation layers 910 and 920, respectively. In other words, the oxidation layer 910 is present between the first N-work function metal layer 224 and the second N-work function metal layer 234, and the oxidation layer 920 is present between the first N-work function metal layer 226 and the second N-work function metal layer 236.

Thereafter, remaining openings 162, 164 and 166 are then filled or overfilled with a filling conductor 240. In some embodiments, the filling conductor 240 includes, for example, tungsten (W). The filling conductor 240 can be formed using ALD, PVD, CVD, or other suitable process. In some other embodiments, the filling conductor 240 includes aluminum (Al), copper (Cu) nickel (Ni), cobalt (Co) or other suitable conductive material. Portions of the filling conductor 240 respectively present in the openings 162, 164 and 166 can be referred to as filling conductor layers 242, 244 and 246. In some embodiments, an additional glue layer may be formed on the second N-work function metal 230, and the filling conductor 240 may be formed on the glue layer. Such a glue layer may include, for example, TiN, which may increase the adhering strength of the filling conductor 240 and second N-work function metal 230.

Figure 13:
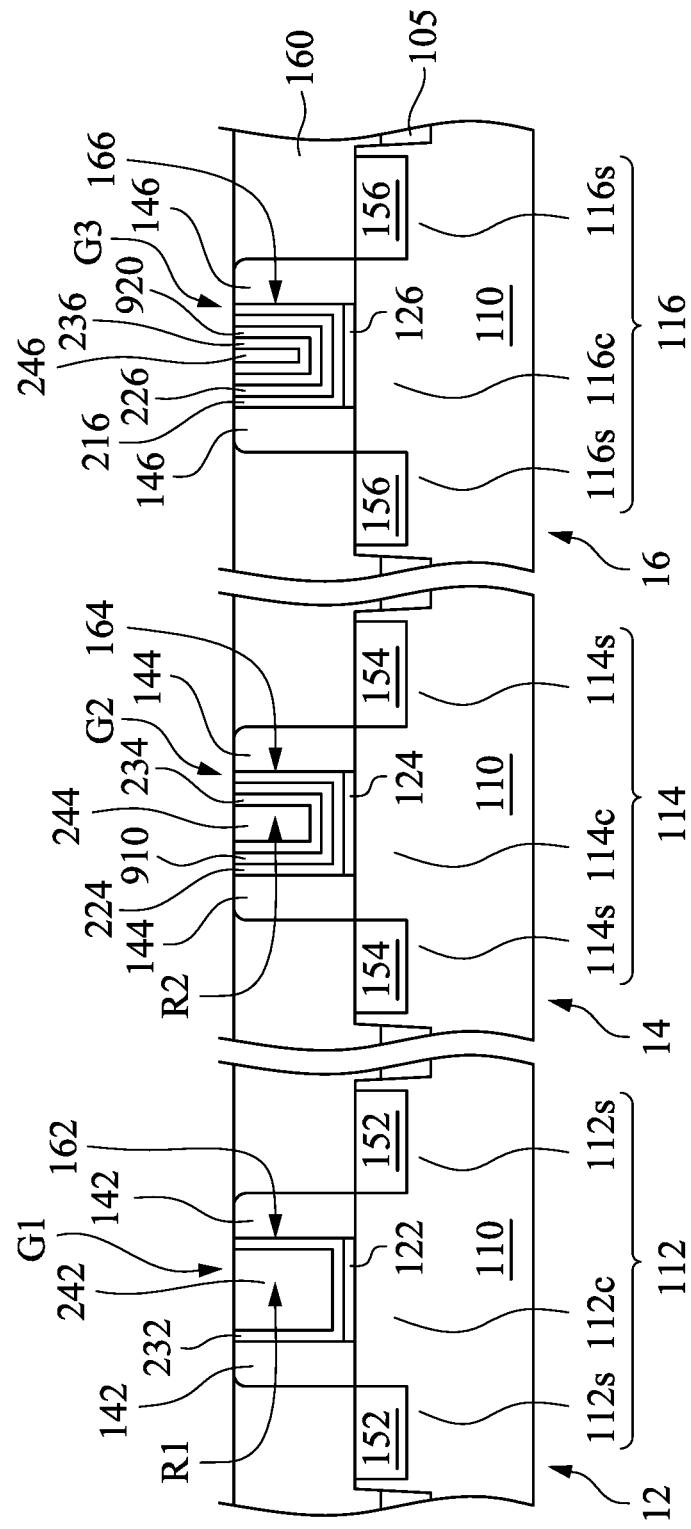

Reference is made to FIG. 13. A chemical mechanical planarization (CMP) process is applied to remove excessive the P-work function metal 210, the first N-work function metal 220, the second N-work function metal 230 and the filling conductor 240 outside the openings 162, 164 and 166 to provide a substantially planar top surface. The excess oxidation layers 910 and 920 outside the openings 164 and 166 are removed as well. The remaining second N-work function metal layer 232 and the remaining filling conductor layer 242 form a gate stack G1 in the opening 162. The remaining first N-work function metal layer 224, the remaining oxidation layer 910, the remaining second N-work function metal layer 234 and the remaining filling conductor layer 244 form a gate stack G2 in the opening 164. The remaining P-work function metal layer 216, the remaining first N-work function metal layer 226, the remaining oxidation layer 920, the remaining second N-work function metal layer 236 and the remaining filling conductor layer 246 form a gate stack G3 in the opening 166. The gate stacks G1, G2 and G3 may be referred to as metal gate electrodes in some cases. It is understood that the formation of the gate stacks G1, G2 and G3 mentioned above is illustrative, and is not limiting the present disclosure.

In FIG. 13, the semiconductor fin 112, the epitaxy structures 152 and the gate stack G1 form a FinFET 12, the semiconductor fin 114, the epitaxy structures 154 and the gate stack G2 form a FinFET 14, and the semiconductor fin 116, the epitaxy structures 156 and the gate stack G3 form a FinFET 16. In some embodiments, at least one of the FinFETs 12, 14 and 16 may be an N-type FinFET when the at least one of the FinFETs 12, 14 and 16 includes N-type doped source/drain epitaxy structures. In some embodiments, at least one of the FinFETs 12, 14 and 16 may be a P-type FinFET when the at least one of the FinFETs 12, 14 and 16 includes P-type doped source/drain epitaxy structures.

Since the gate stack G1 includes the second N-work function metal layer 232, and the gate stack G2 includes the first and second N-work function metal layers 224 and 234, the gate stacks G1 and G2 are different at least in N-work function metal composition, N-work function metal amount or combinations thereof. In other words, the N-work function metal in the gate stacks G1 and G2 are substantially different, and the difference may include at least one of N-work function metal type and N-work function metal amount. Such a difference between the gate stacks G1 and G2 can benefit to achieve a predetermined difference between threshold voltages of the FinFETs 12 and 14. In some embodiments, the second N-work function metal layer 232 can be referred to as an N-work function metal structure in the gate stack G1, and the first and second N-work function metal layers 224 and 234 can be collectively referred to as an N-work metal structure in the gate stack G2. The N-work function metal structure in the gate stack G1 is a monolayer structure (or single layer structure), and the N-work function metal structure in the gate stack G2 is a multilayer structure having a thickness different from that of the monolayer N-work function metal structure in the gate stack G1. More particularly, the multilayer N-work function metal structure in the gate stack G2 may be thicker than the monolayer N-work function metal structure in the gate stack G1. In other words, the multilayer N-work function metal structure in the gate stack G2 includes N-work function metal amount per unit area greater than that of the monolayer N-work function metal structure in the gate stack G1, so that the effective work functions of the gate stacks G1 and G2 can be different. Therefore, the threshold voltages of the FinFETs 12 and 14 can be different. In some embodiments, the first N-work function metal layer 224 can be made of a material different from that of the second N-work function metal layers 232 and 234, so that the multilayer N-work function metal structure in the gate stack G2 can have N-work function metal composition different from that of the monolayer N-work function metal structure in the gate stack G1. Therefore, the threshold voltages of the FinFETs 12 and 14 can be different. In some embodiments, a material of the first N-work function metal layer 224 of the gate stack G2 is absent in the gate stack G1, so as to increase the difference between the effective work functions of the gate stacks G1 and G2.

In the gate stack G3, an additional P-work function metal layer 216 is included, and the P-work function metal layer 216 is present between the first N-work function metal layer 226 and the gate dielectric 126. Therefore, the FinFETs 14 and 16 have different threshold voltages, and moreover, the difference between the threshold voltages of the FinFETs 12 and 16 can be increased.

In some embodiments, the filling conductor layer 242 is present in a recess R1 of the second N-work function metal layer 232 in the gate stack G1, and the filling conductor layer 244 is present in a recess R2 of the second N-work function metal layer 234 in the gate stack G2. Since the first N-work function metal layer 224 is present among the second N-work function metal layer 234 and the gate spacers 144 and is absent among the second N-work function metal layer 232 and the gate spacers 142, the filling conductor layer 244 may be narrower than the filling conductor layer 242.

In some embodiments, gate stacks are different at least in N-work function metal composition, N-work function metal amount or combinations thereof, and therefore, the gate stacks can have different effective work functions, so that different threshold voltages can be achieved. In some embodiments, since a metal gate electrode includes N-work function metal layers having different N-work functions, these N-work function metal layers can benefit to achieve a predetermined threshold voltage for the semiconductor device.

According to some embodiments, a semiconductor device includes a first semiconductor channel, a second semiconductor channel, a first gate stack and a second gate stack. The first gate stack includes N-work function metal present on the first semiconductor channel. The second gate stack includes N-work function metal present on the second semiconductor channel. The N-work function metal in the first gate stack and the second gate stack are substantially different. The difference includes at least one of N-work function metal type and N-work function metal amount.

According to some embodiments, a semiconductor device includes a semiconductor substrate, a gate dielectric and a metal gate electrode. The gate dielectric is present on the semiconductor substrate. The metal gate electrode is present on the gate dielectric, and it includes a first N-work function metal layer and a second N-work function metal layer present on the first N-work function metal layer. The second N-work function metal layer has an N-work function different from that of the first N-work function metal layer.

According to some embodiments, a method of manufacturing a semiconductor device includes forming a first N-work function metal on a first semiconductor channel and a second semiconductor channel, removing at least a portion of the first N-work function metal on the second semiconductor channel, forming a second N-work function metal on the first semiconductor channel and the second semiconductor channel, and forming a filling conductor on the second N-work function metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a first semiconductor channel;
 a second semiconductor channel;
 a first gate stack comprising a first N-work function metal layer present on the first semiconductor channel; and
 a second gate stack comprising a second N-work function metal layer present on the second semiconductor channel, wherein work functions of the first and second N-work function metal layers are different and lower than a mid-gap work function that is in a middle of a valance band and a conduction band of silicon.

2. The semiconductor device of claim 1, wherein the first gate stack further comprises a third N-work function metal layer over the first N-work function metal layer, and a combination of the first and third N-work function metal layers has a thickness different from a thickness of the second N-work function metal layer.

3. The semiconductor device of claim 2, wherein one of the first and third N-work function metal layers has a metal composition different from a metal composition of the second N-work function metal layer.

4. The semiconductor device of claim 1, wherein the first gate stack further comprises third N-work function metal layer present on the first N-work function metal layer.

5. The semiconductor device of claim 4, wherein the first N-work function metal layer and the third N-work function metal layer are made of different materials.

6. The semiconductor device of claim 4, wherein first N-work function metal layer and the third N-work function metal layer are made of substantially the same material.

7. The semiconductor device of claim 4, wherein the first gate stack further comprises an oxidation layer present between the first N-work function metal layer and the third N-work function metal layer.

8. The semiconductor device of claim 7, wherein the oxidation layer comprises metal substantially the same as that of the first N-work function metal layer.

9. The semiconductor device of claim 4, wherein the third N-work function metal layer and the second N-work function metal layer are made of substantially the same material.

10. The semiconductor device of claim 9, wherein the first gate stack further comprises a first filling conductor layer present in a recess of the third N-work function metal layer, the second gate stack further comprises a second filling conductor layer present in a recess of the second N-work function metal layer, and the first filling conductor layer is narrower than the second filling conductor layer.

11. The semiconductor device of claim 4, wherein a material of the first N-work function metal layer is absent in the second gate stack.

12. A semiconductor device, comprising:
a semiconductor substrate;
a gate dielectric present on the semiconductor substrate;
a metal gate electrode present on the gate dielectric, the metal gate electrode comprising:
a first N-work function metal layer; and
a second N-work function metal layer present on the first N-work function metal layer, the second N-work function metal layer having an N-work function different from an N-work function of the first N-work function metal layer, wherein the N-work functions of the first and second N-work function metal layers are lower than a mid-gap work function that is in a middle of a valance band and a conduction band of silicon.

13. The semiconductor device of claim 12, further comprising:
an oxidation layer present between the first N-work function metal layer and the second N-work function metal layer.

14. The semiconductor device of claim 13, wherein the oxidation layer is in contact with the first N-work function metal layer.

15. The semiconductor device of claim 13, wherein the oxidation layer comprises metal substantially the same as that in the first N-work function metal layer.

16. The semiconductor device of claim 12, further comprising:
a P-work function metal layer present between the first N-work function metal layer and the gate dielectric.

17. A semiconductor device, comprising:
a semiconductor substrate;
a gate dielectric over the semiconductor substrate; and
a gate structure over the gate dielectric, the gate structure comprising a first N-work function metal layer, an oxide layer over the first N-work function metal layer; and a second N-work function metal layer over the oxide layer, wherein work functions of the first and second N-work function metal layers are different and lower than a mid-gap work function that is in a middle of a valance band and a conduction band of silicon.

18. The semiconductor device of claim 17, wherein the oxide layer is embedded in the first N-work function metal layer.

19. The semiconductor device of claim 17, wherein the second N-work function metal layer is embedded in the oxide layer.

20. The semiconductor device of claim 17, wherein opposite surfaces of the oxide layer are respectively in contact with the first and second N-work function metal layers.

* * * * *